(12) United States Patent
Pillarisetty et al.

(10) Patent No.: US 11,430,949 B2
(45) Date of Patent: Aug. 30, 2022

(54) METAL FILAMENT MEMORY CELLS

(71) Applicant: Intel Corporation, Santa Clara, CA (US)

(72) Inventors: Ravi Pillarisetty, Portland, OR (US); Elijah V. Karpov, Portland, OR (US); Prashant Majhi, San Jose, CA (US); Niloy Mukherjee, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 43 days.

(21) Appl. No.: 16/324,464

(22) PCT Filed: Sep. 25, 2016

(86) PCT No.: PCT/US2016/053618
§ 371 (c)(1),
(2) Date: Feb. 8, 2019

(87) PCT Pub. No.: WO2018/057021
PCT Pub. Date: Mar. 29, 2018

(65) Prior Publication Data
US 2020/0203604 A1 Jun. 25, 2020

(51) Int. Cl.
*H01L 45/00* (2006.01)
*H01L 23/528* (2006.01)
*H01L 27/24* (2006.01)

(52) U.S. Cl.
CPC .......... *H01L 45/085* (2013.01); *H01L 23/528* (2013.01); *H01L 27/2436* (2013.01);
(Continued)

(58) Field of Classification Search
CPC . H01L 45/085; H01L 23/528; H01L 27/2436; H01L 45/1233; H01L 45/1266;
(Continued)

(56) References Cited

U.S. PATENT DOCUMENTS 9,530,495 B1 * 12/2016 Dinh .................... H01L 45/1266
9,805,794 B1 * 10/2017 Li ....................... G11C 13/0009
(Continued)

FOREIGN PATENT DOCUMENTS

WO    2013040714 A1    3/2013
WO    2018057021 A1    3/2018

OTHER PUBLICATIONS

PCT International Search Report and Written Opinion issued in PCT Application No. PCT/US2016/053618 dated Apr. 25, 2017; 11 pages.

*Primary Examiner* — Shahed Ahmed
(74) *Attorney, Agent, or Firm* — Akona IP

(57) ABSTRACT

Disclosed herein are metal filament memory cells, and related devices and techniques. In some embodiments, a memory cell may include: a transistor having a source/drain region; and a metal filament memory device including an active metal and an electrolyte; wherein the electrolyte is coupled between the active metal and the source/drain region when the transistor is an n-type metal oxide semiconductor (NMOS) transistor, and the active metal is coupled between the electrolyte and the source/drain region when the transistor is a p-type metal oxide semiconductor (PMOS) transistor.

15 Claims, 5 Drawing Sheets

(52) U.S. Cl.
CPC ...... *H01L 45/1233* (2013.01); *H01L 45/1266* (2013.01); *H01L 45/142* (2013.01); *H01L 45/144* (2013.01); *H01L 45/146* (2013.01); *H01L 45/1625* (2013.01)

(58) Field of Classification Search
CPC ... H01L 45/142; H01L 45/144; H01L 45/146; H01L 45/1625
See application file for complete search history.

(56) References Cited

U.S. PATENT DOCUMENTS

| | | | |
|---|---|---|---|
| 9,805,974 B1* | 10/2017 | Chen | C23C 16/45523 |
| 2006/0019501 A1* | 1/2006 | Jin | H01L 21/02148 |
| | | | 438/785 |
| 2010/0002491 A1* | 1/2010 | Hwang | H01L 45/142 |
| | | | 365/148 |
| 2010/0123117 A1 | 5/2010 | Sun et al. | |
| 2011/0310656 A1 | 12/2011 | Kreupl et al. | |
| 2013/0034947 A1* | 2/2013 | Hong | H01L 45/1616 |
| | | | 438/384 |
| 2014/0185358 A1* | 7/2014 | Jo | H01L 45/04 |
| | | | 365/148 |
| 2014/0312296 A1* | 10/2014 | Jo | H01L 45/146 |
| | | | 257/4 |
| 2015/0235698 A1* | 8/2015 | Tsai | H01L 45/146 |
| | | | 365/148 |
| 2016/0163977 A1* | 6/2016 | Wang | H01L 45/12 |
| | | | 257/4 |
| 2016/0380194 A1* | 12/2016 | Karpov | H01L 45/1253 |
| | | | 257/4 |
| 2017/0062526 A1* | 3/2017 | Lu | H01L 45/1246 |

* cited by examiner

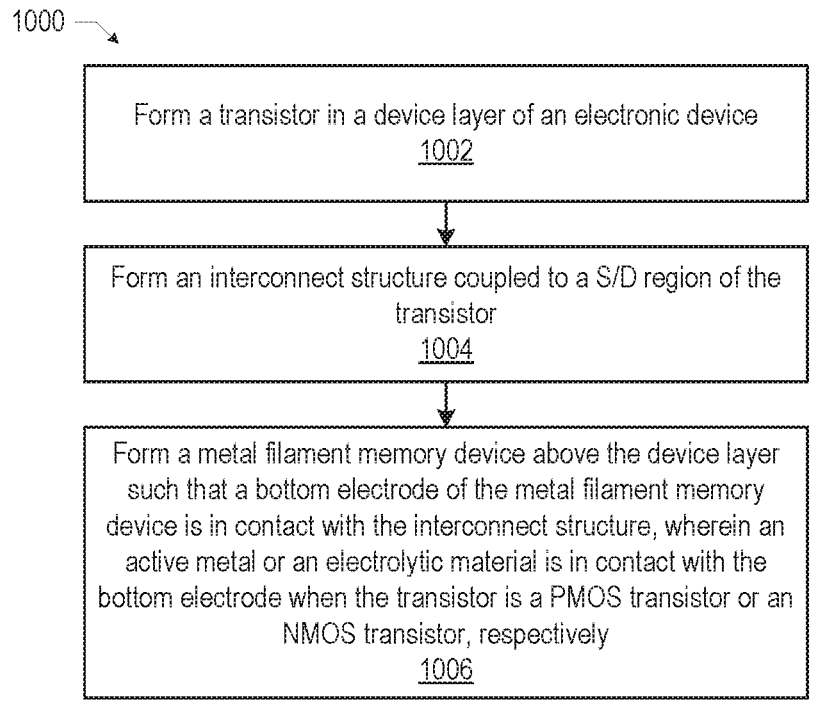
FIG. 9
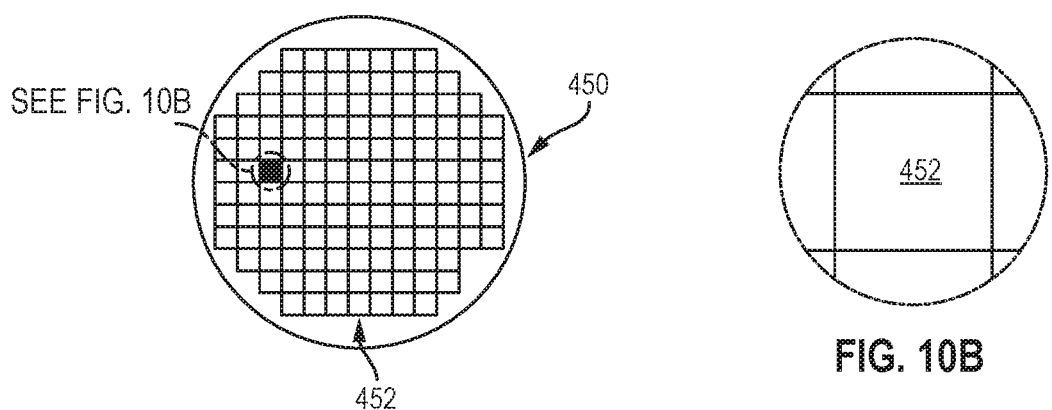
FIG. 10A
FIG. 10B

METAL FILAMENT MEMORY CELLS

CROSS-REFERENCE TO RELATED APPLICATION

This application is a national phase entry of PCT International Application No. PCT/US2016/053618, filed Sep. 25, 2016, entitled "METAL FILAMENT MEMORY CELLS." The disclosure of this prior application is incorporated by reference herein in its entirety.

BACKGROUND

A nonvolatile random access memory (NVRAM) device is a memory device that retains its data in the absence of supplied power. Flash memory is an example of an existing NVRAM technology, but flash memory may be limited in its speed, endurance, area, and lifetime.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 9 is a flow diagram of an illustrative method of manufacturing a memory cell, in accordance with various embodiments.

FIGS. 10A and 10B are top views of a wafer and dies that may include any of the MFMDs disclosed herein.

DETAILED DESCRIPTION

Disclosed herein are metal filament memory cells, and related devices and techniques. In some embodiments, a memory cell may include: a transistor having a source/drain region; and a metal filament memory device including an active metal and an electrolyte; wherein the electrolyte is coupled between the active metal and the source/drain region when the transistor is an n-type metal oxide semiconductor (NMOS) transistor, and the active metal is coupled between the electrolyte and the source/drain region when the transistor is a p-type metal oxide semiconductor (PMOS) transistor.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The disclosure may use the singular term "layer," but the term "layer" should be understood to refer to assemblies that may include multiple different material layers. The accompanying drawings are not necessarily drawn to scale.

Figure 1:
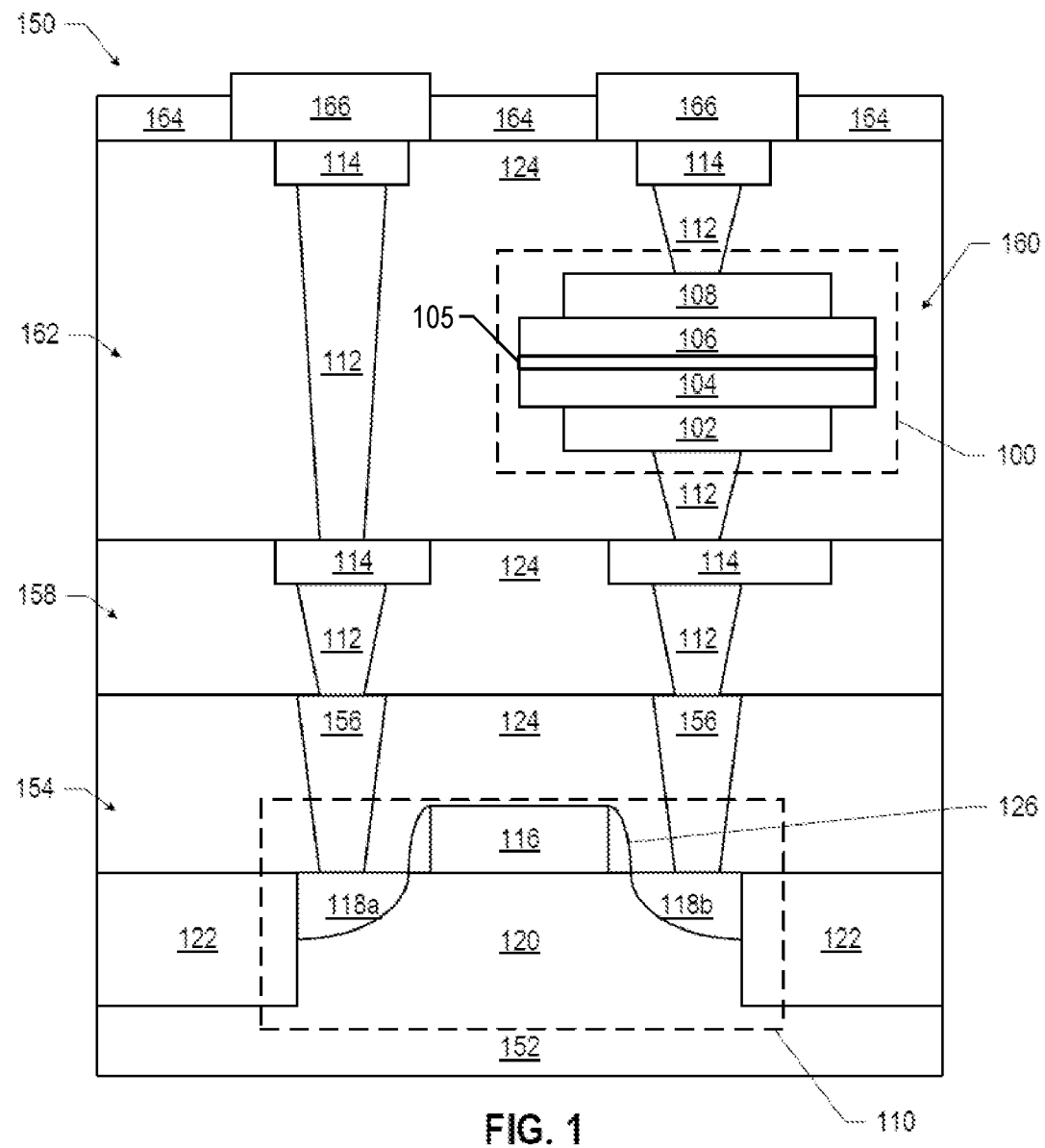
FIG. 1 is a cross-sectional view of an example electronic device including a memory cell having an embodiment of a metal filament memory device (MFMD) coupled to an n-type metal oxide semiconductor (NMOS) transistor, in accordance with various embodiments.

FIG. 1 is a side cross-sectional view of an example electronic device 150 including a memory cell 160 having a metal filament memory device (MFMD) 100 coupled to a transistor 110, in accordance with various embodiments. As discussed in detail below, during operation, the MFMD 100 may switch between two different nonvolatile states: a high resistance state (HRS) and a low resistance state (LRS). The state of the MFMD 100 may be used to represent a data bit (e.g., a "1" for HRS and a "0" for LRS, or vice versa). The transistor 110 may help control the current provided to the MFMD 100 during use, as discussed below.

The electronic device 150 may be formed on a substrate 152 (e.g., the wafer 450 of FIG. 10A, discussed below) and may be included in a die (e.g., the die 452 of FIG. 10B, discussed below). The substrate 152 may be a semiconductor substrate composed of semiconductor material systems including, for example, n-type or p-type material systems. The substrate 152 may include, for example, a crystalline substrate formed using a bulk silicon or a silicon-on-insulator substructure. In some embodiments, the semiconductor substrate 152 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the substrate 152. Although a few examples of materials from which the substrate 152 may be formed are described here, any material that may serve as a foundation for an electronic device 150 may be used. The substrate 152 may be part of a singulated die (e.g., the dies 452 of FIG. 10B) or a wafer (e.g., the wafer 450 of FIG. 10A).

The electronic device 150 may include one or more device layers 154 disposed on the substrate 152. The device layer 154 may include features of one or more transistors 110 (e.g., metal oxide semiconductor field-effect transistors (MOSFETs)) formed on the substrate 152. The device layer 154 may include, for example, one or more source and/or drain (S/D) regions 118, a gate 116 to control current flow in the channel 120 of the transistors 110 between the S/D regions 118, and one or more S/D contacts 156 (which may take the form of conductive vias) to route electrical signals to/from the S/D regions 118. Adjacent transistors 110 may be isolated from each other by a shallow trench isolation (STI) insulating material 122, in some embodiments. The transistors 110 may include additional features not depicted for the sake of clarity, such as device isolation regions, gate contacts, and the like. The transistors 110 are not limited to the type and configuration depicted in FIG. 1 and may include a wide variety of other types and configurations such as, for example, planar transistors, nonplanar transistors, or a combination of both. Nonplanar transistors may include FinFET transistors, such as double-gate transistors or tri-gate transistors, and wrap-around or all-around gate transistors, such as nanoribbon and nanowire transistors.

Each transistor 110 may include a gate 116 formed of at least two layers, a gate dielectric layer and a gate electrode layer. The gate electrode layer may include at least one p-type work function metal or n-type work function metal, depending on whether the transistor 110 is to be a p-type metal oxide semiconductor (PMOS) transistor or an n-type metal oxide semiconductor (NMOS) transistor. For a PMOS transistor, metals that may be used for the gate electrode layer may include, but are not limited to, ruthenium, palladium, platinum, cobalt, nickel, and conductive metal oxides (e.g., ruthenium oxide). For an NMOS transistor, metals that may be used for the gate electrode layer include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode layer may consist of a stack of two or more metal layers, where one or more metal layers are work function metal layers and at least one metal layer is a fill metal layer. Further metal layers may be included for other purposes, such as to act as a barrier layer. The gate dielectric layer may be, for example, silicon oxide, aluminum oxide, or a high-k dielectric, such as hafnium oxide. More generally, the gate dielectric layer may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric layer may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric layer to improve the quality of the gate dielectric layer. The transistor 110 of FIGS. 1 and 2 may be an NMOS transistor, and the transistor 110 of FIGS. 3 and 4 may be a PMOS transistor, as discussed below.

In some embodiments, when viewed as a cross section of the transistor 110 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar non-U-shaped structures. For example, the gate electrode may consist of one or more U-shaped metal layers formed atop one or more planar non-U-shaped layers. In some embodiments, the gate electrode may consist of a V-shaped structure.

In some embodiments, a pair of sidewall spacers 126 may be formed on opposing sides of the gate 116 to bracket the gate stack. The sidewall spacers 126 may be formed from a material such as silicon nitride, silicon oxide, silicon carbide, silicon nitride doped with carbon, and silicon oxynitride. Processes for forming sidewall spacers 126 are well known in the art and generally include deposition and etching process steps. In some embodiments, multiple pairs of sidewall spacers 126 may be used; for instance, two pairs, three pairs, or four pairs of sidewall spacers 126 may be formed on opposing sides of the gate stack.

The S/D regions 118 may be formed within the substrate 152 adjacent to the gate 116 of each transistor 110. For example, the S/D regions 118 may be formed using either an implantation/diffusion process or a deposition process. In the former process, dopants such as boron, aluminum, antimony, phosphorous, or arsenic may be ion-implanted into the substrate 152 to form the S/D regions 118. An annealing process that activates the dopants and causes them to diffuse farther into the substrate 152 may follow the ion implantation process. In the latter process, an epitaxial deposition process may provide material that is used to fabricate the S/D regions 118. In some implementations, the S/D regions 118 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 118 may be formed using one or more alternate semiconductor materials such as germanium or a group III-V material or alloy. In further embodiments, one or more layers of metal and/or metal alloys may be used to form the S/D regions 118. In some embodiments, an etch process may be performed before the epitaxial deposition to create recesses in the substrate 152 in which the material for the S/D regions 118 is deposited.

Electrical signals, such as power and/or input/output (I/O) signals, may be routed to and/or from the transistors 110 of the device layer 154 through one or more interconnect layers disposed on the device layer 154 (illustrated in FIG. 1 as interconnect layers 158 and 162). For example, electrically conductive features of the device layer 154 (e.g., the gate 116 and the S/D contacts 156) may be electrically coupled with the interconnect structures including conductive vias 112 and/or conductive lines 114 of the interconnect layers 158 and 162. The one or more interconnect layers 158 and 162 may form an interlayer dielectric (ILD) stack of the electronic device 150.

The interconnect structures may be arranged within the interconnect layers 158 and 162 to route electrical signals according to a wide variety of designs (in particular, the arrangement is not limited to the particular configuration of interconnect structures depicted in FIG. 1). Although a particular number of interconnect layers is depicted in FIG. 1, embodiments of the present disclosure include electronic devices having more or fewer interconnect layers than depicted.

In some embodiments, the interconnect structures may include conductive lines 114 (sometimes referred to as "trench structures") and/or conductive vias 112 (sometimes referred to as "holes") filled with an electrically conductive material such as a metal. The conductive lines 114 may be arranged to route electrical signals in a direction of a plane that is substantially parallel with a surface of the substrate 152 upon which the device layer 154 is formed. For example, the conductive lines 114 may route electrical signals in a direction in and out of the page from the perspective of FIG. 1. The conductive vias 112 may be arranged to route electrical signals in a direction of a plane that is substantially perpendicular to the surface of the substrate 152 upon which the device layer 154 is formed. In some embodiments, the conductive vias 112 may electrically couple conductive lines 114 of different interconnect layers 158 and 162 together.

The interconnect layers 158 and 162 may include a dielectric material 124 disposed between the interconnect structures, as shown in FIG. 1. In some embodiments, the dielectric material 124 disposed between the interconnect structures in different ones of the interconnect layers 158 and 162 may have different compositions; in other embodiments, the composition of the dielectric material 124 between different interconnect layers 158 and 162 may be the same.

A first interconnect layer 158 (referred to as Metal 1 or "M1") may be formed directly on the device layer 154. In some embodiments, the first interconnect layer 158 may include conductive lines 114 and/or conductive vias 112, as shown. The conductive lines 114 of the first interconnect layer 158 may be coupled with contacts (e.g., the S/D contacts 156) of the device layer 154.

A second interconnect layer 162 (referred to as Metal 2 or "M2") may be formed directly on the first interconnect layer 158. In some embodiments, the second interconnect layer 162 may include conductive vias 112 to couple the conductive lines 114 of the second interconnect layer 162 with the conductive lines 114 of the first interconnect layer 158. Although the conductive lines 114 and the conductive vias 112 are structurally delineated with a line within each interconnect layer (e.g., within the second interconnect layer 162) for the sake of clarity, the conductive lines 114 and the conductive vias 112 may be structurally and/or materially contiguous (e.g., simultaneously filled during a dual-damascene process) in some embodiments.

Additional interconnect layers may be formed in succession on the second interconnect layer 162 according to similar techniques and configurations described in connection with the first interconnect layer 158 or the second interconnect layer 162.

The electronic device 150 may include a solder resist material 164 (e.g., polyimide or similar material) and one or more bond pads 166 formed on the interconnect layers. The bond pads 166 may be electrically coupled with the interconnect structures and may route the electrical signals of the memory cell 160 to other external devices. For example, solder bonds may be formed on the one or more bond pads 166 to mechanically and/or electrically couple a chip including the electronic device 150 with another component (e.g., a circuit board). The electronic device 150 may include other structures to route the electrical signals from the interconnect layers than depicted in other embodiments. For example, the bond pads 166 may be replaced by or may further include other analogous features (e.g., posts) that route electrical signals to external components.

As noted above, the electronic device 150 may include an MFMD 100 electrically coupled to a transistor 110, forming a memory cell 160. The MFMD 100 is illustrated as being included in the second interconnect layer 162, but the MFMD 100 may be located in any suitable interconnect layer or other portion of the electronic device 150.

The MFMD 100 of FIG. 1 may include a bottom electrode 102, an electrolyte 104, an active metal 106, and a top electrode 108. The electrolyte 104 may be disposed between the bottom electrode 102 and the active metal 106, and the active metal 106 may be disposed between the electrolyte 104 and the top electrode 108. In any of the embodiments disclosed herein, a chemical barrier layer 105 may be disposed between the active metal 106 and the electrolyte 104 to mitigate diffusion of the active metal 106 into the electrolyte 104; examples of materials that may be used in such a barrier layer 105 may include tantalum, tantalum nitride, or tungsten, as appropriate. The bottom electrode 102 may be electrically coupled to an S/D region 118 of the transistor 110 (e.g., through one or more conductive vias 112, conductive lines 114, and S/D contacts 156). Thus, the bottom electrode 102 of the MFMD 100 may be electrically coupled between the transistor 110 and the top electrode 108 of the MFMD 100.

The bottom electrode 102 and the top electrode 108 of the MFMD 100 may be formed of an inert metal. For example, in some embodiments, the bottom electrode 102 and the top electrode 108 may be formed of iridium, palladium, platinum, or ruthenium, or nitrides of more reactive metals, such as titanium nitride or tantalum nitride, for example. In some embodiments, the bottom electrode 102 and/or the top electrode 108 may be formed by physical vapor deposition (PVD) (e.g., sputtering) or atomic layer deposition (ALD).

The electrolyte 104 may be a solid electrolyte, and may take any suitable form. In some embodiments, the electrolyte 104 may be an oxide, such as aluminum oxide or hafnium oxide. In some embodiments, the electrolyte 104 may be a multi-component alloy including group-IV and VI elements, such as germanium sulfide or silicon telluride. In some embodiments, the electrolyte 104 may be a multilayer oxide formed by, for example, PVD.

The active metal 106 may be an electrochemically active metal with high solubility in solid electrolytes, such as silver or copper.

Figure 2:
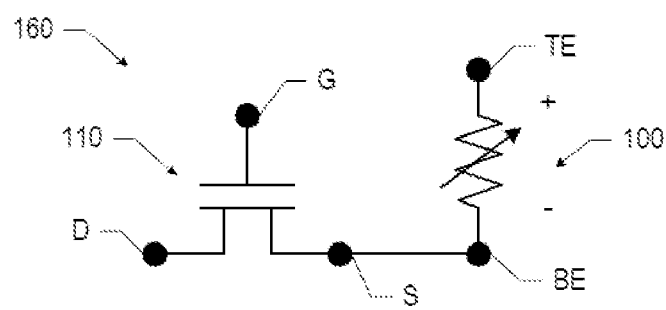
FIG. 2 is a schematic illustration of the memory cell of FIG. 1, in accordance with various embodiments.

FIG. 2 is a schematic illustration of the memory cell 160 of FIG. 1, showing that the transistor 110 of FIG. 1 is an NMOS transistor 110, in accordance with various embodiments. In particular, FIG. 2 illustrates the transistor 110, its gate node G (corresponding to the gate 116), its drain node D (corresponding to the S/D region 118a), and its source node S (corresponding to the S/D region 118b). FIG. 2 also illustrates the MFMD 100 (using a variable resistor circuit symbol), its top electrode node TE (corresponding to the top electrode 108) and its bottom electrode node BE (corresponding to the bottom electrode 102).

An amply positive voltage applied to the MFMD 100 of FIG. 1 (e.g., applied between the TE node and the BE node, as shown in FIG. 2) may cause ions of the active metal 106 to migrate along the electric field between the top electrode 108 and the bottom electrode 102, forming one or more filaments that provide conductive pathways between the top electrode 108 and the bottom electrode 102, bringing the MFMD 100 into its LRS. Driving the MFMD 100 into the LRS may be referred to as SET (with an associated SET voltage).

Once in the LRS, an amply negative voltage applied to the MFMD 100 of FIG. 1 may reduce the filaments until they no longer provide an electrical bridge between the bottom electrode 102 and the top electrode 108, bringing the MFMD 100 into its HRS. Driving the MFMD 100 into the HRS may be referred to as RESET (with an associated RESET voltage). The state of the MFMD 100 may be "read" by applying a voltage across the MFMD 100 to determine its resistance; the magnitude of this voltage should be small enough to avoid inadvertently triggering a SET or RESET. The MFMD 100 may thus be referred to as "conductive-bridging random access memory" (CBRAM), or as a programmable metallization cell. For an MFMD 100 as illustrated in FIG. 1, the (positive) SET voltage may have a larger magnitude than the (negative) RESET voltage, and thus the MFMD 100 may be "asymmetric" in its operation.

In the embodiment illustrated in FIG. 1 (and FIG. 3, discussed below), the bottom electrode 102 and the top electrode 108 are shown as having smaller footprints than the electrolyte 104 and the active metal 106; such an arrangement may focus the areas of filament formation in the bulk of the active metal 106, rather than at the edges (where non-idealities may occur). In some embodiments, only the top electrode 108 has such a smaller footprint; in other embodiments, neither the top electrode 108 nor the bottom electrode 102 has a smaller footprint.

During use of the memory cell 160 of FIG. 2, the gate node G may be coupled to a word line, the drain node D may be coupled to ground, and the top electrode node TE may be coupled to a bit line. To cause a positive voltage drop across the MFMD 100 (as would be needed to SET the MFMD 100 of FIG. 1), the top electrode node TE and the gate node G may be coupled to a positive first voltage (e.g., 1.5 V). In this arrangement, the transistor 110 may conduct. Thus, the full first voltage may drop across the MFMD 100, and the gate-source voltage (between the gate node G and the source node S) may also be equal to the full first voltage. If the first voltage is equal to or exceeds the SET voltage, the MFMD 100 may SET.

To cause a negative voltage drop across the MFMD 100 (as would be needed to RESET the MFMD 100 of FIG. 1), the top electrode node TE may be coupled to the negative of the first voltage (e.g., −1.5 V); the transistor 110 may conduct in the opposite direction and the source node S may have a voltage between the negative first voltage (applied at the top electrode node TE) and ground (at the gate node G). Thus, the gate-source voltage may have a magnitude less than the full first voltage (present between the gate and source during SET, as described above). This phenomenon may be referred to as "source degeneration," and the decreased gate-source voltage may result in weaker operation of the transistor 110 (e.g., a reduced ability to source/sink current) relative to the larger gate-source voltage that may occur during SET. If the voltage drop across the MFMD 100 is equal to or exceeds the RESET voltage, the MFMD 100 may RESET.

As discussed above, the operation of the memory cell 160 of FIGS. 1 and 2 may thus be asymmetric; the NMOS transistor 110 may be "stronger" during SET than RESET. This asymmetry, however, may be complementary to the asymmetry in RESET and SET voltages of the MFMD 100 of FIG. 1; as discussed above, the (positive) SET voltage may have a larger magnitude than the (negative) RESET voltage. Since the asymmetry in the MFMD 100 of FIGS. 1 and 2 is such that the magnitude of its intrinsic RESET voltage is less than the magnitude of its SET voltage, source degeneration may not affect circuit operation in RESET. Having a transistor 110 that is "well matched" in this manner to the MFMD 100 in a memory cell 160 may reduce the energy consumed by the memory cell 160 relative to a cell in which the components are not as well matched. For example, if the transistor 110 were a PMOS transistor, the PMOS transistor would be "stronger" during RESET than SET, and thus must be larger or more strongly driven in order to provide the greater SET voltage required by the MFMD 100. Additionally, PMOS transistors are typically able to drive less current than NMOS transistors, so even further compensation may be required. Thus, the use of an NMOS transistor 110 and the MFMD 100 of FIG. 1 in a memory cell 160 may provide a particularly advantageous memory cell 160.

Figure 3:
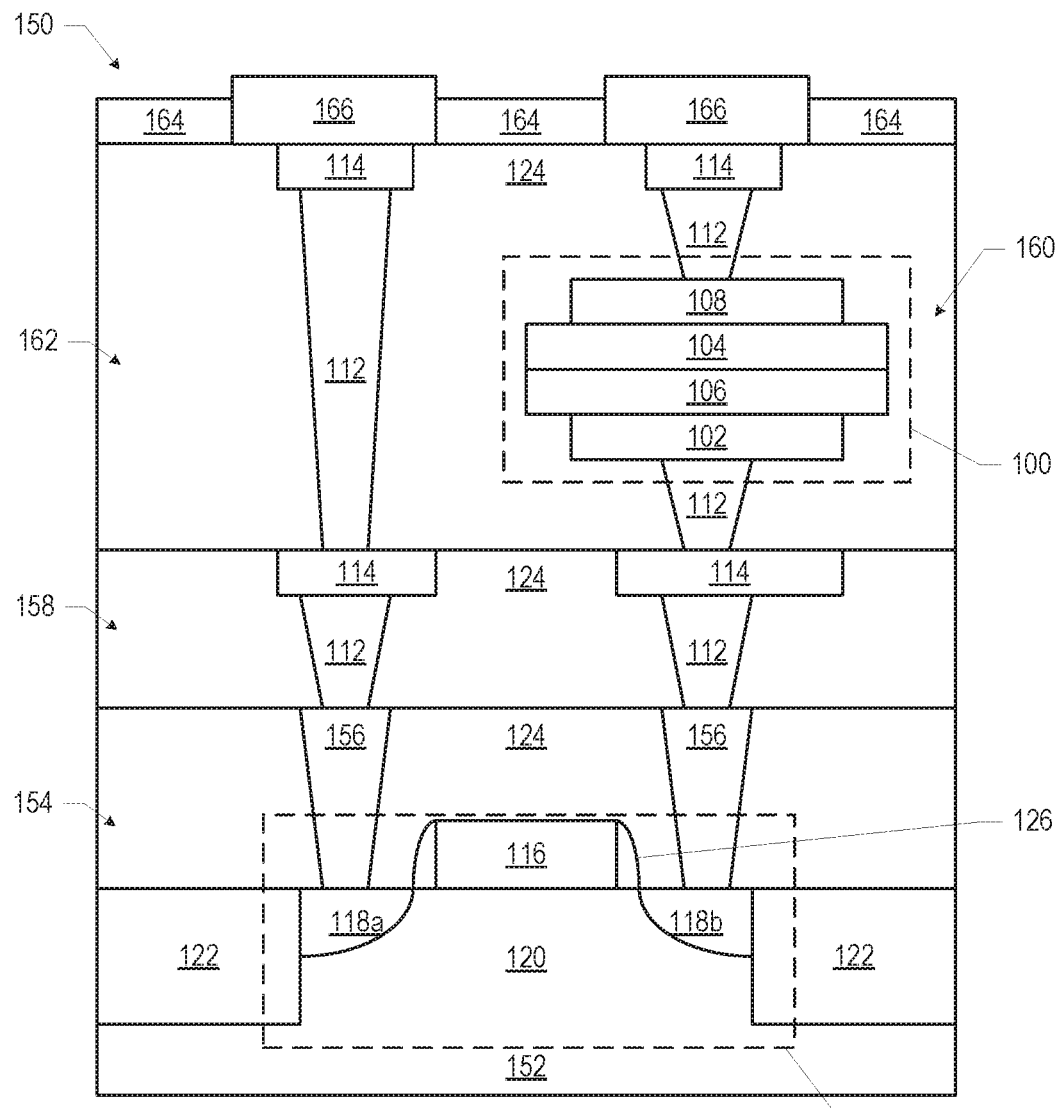
FIG. 3 is a cross-sectional view of an example electronic device including a memory cell having another embodiment of an MFMD coupled to a p-type metal oxide semiconductor (PMOS) transistor, in accordance with various embodiments.
Figure 4:
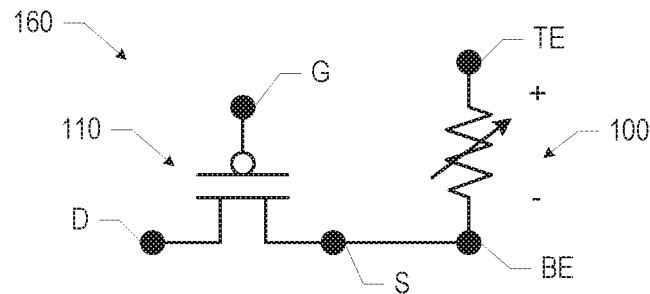
FIG. 4 is a schematic illustration of the memory cell of FIG. 3, in accordance with various embodiments.

FIGS. 3 and 4 illustrate another embodiment of a memory cell 160 whose structure utilizes the same asymmetry/source degeneration principles as the memory cell 160 discussed above with reference to FIGS. 1 and 2. In particular, FIG. 3 is a side cross-sectional view of an example electronic device 150 including a memory cell 160 having an MFMD 100 coupled to a transistor 110, and FIG. 4 is a schematic illustration of the memory cell 160 of FIG. 3, showing that the transistor 110 of FIG. 3 is a PMOS transistor 110. The structure of the electronic device 150 and the MFMD 100 of FIG. 3 may take the form of any of the embodiments discussed above with reference to the electronic device 150 of FIG. 1, but the transistor 110 of FIG. 3 may be a PMOS transistor, and in the MFMD 100 of FIG. 3, the active metal 106 may be coupled between the electrolyte 104 and the bottom electrode 102, and the electrolyte 104 may be disposed between the active metal 106 and the top electrode 108.

Operation of the MFMD 100 of FIG. 3 may be complementary to operation of the MFMD 100 of FIG. 1. For example, an amply negative voltage applied to the MFMD 100 of FIG. 3 (e.g., applied between the TE node and the BE node, as shown in FIG. 4) may cause ions of the active metal 106 to migrate along the electric field between the top electrode 108 and the bottom electrode 102, forming one or more filaments that provide conductive pathways between the top electrode 108 and the bottom electrode 102, bringing the MFMD 100 of FIG. 3 into its LRS.

Once in the LRS, an amply positive voltage applied to the MFMD 100 of FIG. 3 may reduce the filaments until they no longer provide an electrical bridge between the bottom electrode 102 and the top electrode 108, bringing the MFMD 100 of FIG. 3 into its HRS. For an MFMD 100 as illustrated in FIG. 3, the (negative) SET voltage may have a larger magnitude than the (positive) RESET voltage, and thus the MFMD 100 of FIG. 3 may be "asymmetric" in its operation.

As discussed above with reference to FIG. 2, during use of the memory cell 160 of FIG. 4, the gate node G may be coupled to a word line, the drain node D may be coupled to ground, and the top electrode node TE may be coupled to a bit line. To cause a negative voltage drop across the MFMD 100 (as would be needed to SET the MFMD 100 of FIG. 3), the top electrode node TE may be coupled to a negative first voltage (e.g., −1.5 V). In this arrangement, the transistor 110 may conduct. If the first voltage is equal to or exceeds the SET voltage, the MFMD 100 may SET.

To cause a positive voltage drop across the MFMD 100 (as would be needed to RESET the MFMD 100 of FIG. 1), the top electrode node TE may be coupled to the positive polarity of the first voltage (e.g., 1.5 V); the transistor 110 may conduct in the opposite direction and the source node S may have a voltage between the positive first voltage (applied at the top electrode node TE) and ground (at the gate node G). Thus, the gate-source voltage may have a magnitude less than the full first voltage (present between the gate and source during SET). Thus, for the MFMD 100 and transistor 110 of FIGS. 3 and 4, source degeneration may result in weaker operation of the transistor 110 (e.g., a reduced ability to source/sink current) during RESET relative to the larger gate-source voltage that may occur during SET. Even in this scenario, if the voltage drop across the MFMD 100 is equal to or exceeds the RESET voltage, the MFMD 100 may RESET.

Thus, as discussed above with reference to FIGS. 1 and 2, the operation of the memory cell 160 of FIGS. 3 and 4 may be asymmetric; the PMOS transistor 110 may be "stronger" during SET than RESET, and this asymmetry may be complementary to the asymmetry in RESET and SET voltages of the MFMD 100 of FIG. 3 (in which the (negative) SET voltage may have a larger magnitude than the (positive) RESET voltage). Since the asymmetry in the MFMD 100 of FIGS. 3 and 4 is such that the magnitude of its intrinsic RESET voltage is less than the magnitude of its SET voltage, source degeneration may not affect circuit operation in RESET. The memory cell 160 of FIGS. 3 and 4 thus represents an alternative well-matched cell, which may exhibit reduced energy consumption relative to a cell in which the components are not as well matched, as discussed above.

The MFMDs 100 disclosed herein may be formed using any suitable technique. For example, FIGS. 5-8 illustrate various example stages in the manufacture of the MFMD 100 of FIG. 1, in accordance with various embodiments. The techniques discussed with reference to FIGS. 5-8 may also be used to manufacture the MFMD 100 of FIG. 3, but the order in which the electrolyte 104 and the active metal 106 are deposited may be swapped. Any suitable patterning techniques may be used to control the shape of the components of the MFMD 100 during manufacture (e.g., semi-additive techniques, subtractive techniques, or other techniques), and are thus not discussed further herein.

Figure 5:
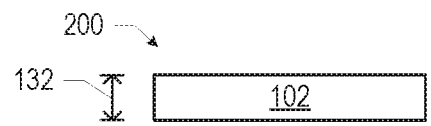
FIGS. 5-8 illustrate various example stages in the manufacture of the MFMD of FIG. 1, in accordance with various embodiments.

FIG. 5 is a side cross-sectional view of an assembly 200 subsequent to forming a bottom electrode 102. The bottom electrode 102 of the assembly 200 may take any of the forms disclosed herein. The bottom electrode 102 may be formed as part of an interconnect layer, as discussed above with reference to FIG. 1, and may be in conductive contact with an S/D region 118 of a transistor 110 (e.g., through one or more conductive lines and/or vias). In some embodiments, the transistor 110 may be an NMOS transistor; when the MFMD 100 of FIGS. 3 and 4 is being manufactured, the transistor 110 may be a PMOS transistor. In some embodiments, the bottom electrode 102 may be formed by PVD (e.g., sputtering). The bottom electrode 102 may have a thickness 132 that may take any suitable value. For example, the thickness 132 may be between 3 and 100 nanometers. In some embodiments (e.g., when the thickness 132 is between 3 and 20 nanometers, or otherwise small), an additional layer of "dummy" conductive material may be deposited to form a bilayer structure; such a structure may meet the integration requirements of devices like those shown in FIGS. 1 and 3.

Figure 6:
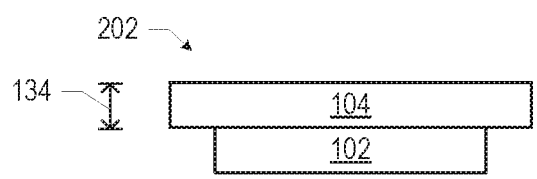

FIG. 6 is a side cross-sectional view of an assembly 202 subsequent to forming an electrolyte 104 on the bottom electrode 102 of the assembly 200 (FIG. 5). The electrolyte 104 may take any of the forms disclosed herein. The electrolyte 104 may have a thickness 134 that may take any suitable value. For example, the thickness 134 may be between 3 and 10 nanometers.

Figure 7:
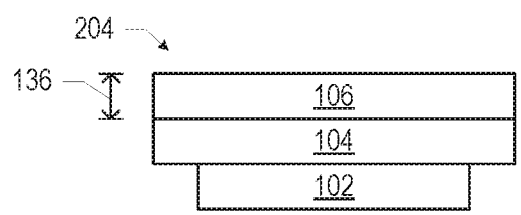

FIG. 7 is a side cross-sectional view of an assembly 204 subsequent to forming an active metal 106 on the electrolyte 104 of the assembly 202 (FIG. 6). The active metal 106 may have a thickness 136 that may take any suitable value. For example, the thickness 136 may be between 2 and 5 nanometers.

Figure 8:
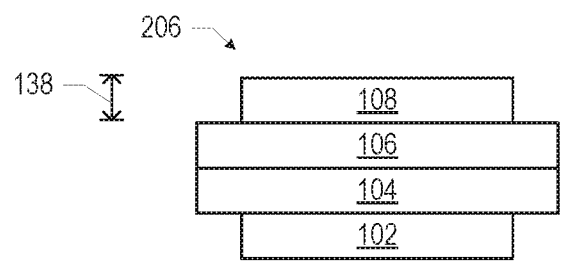

FIG. 8 is a side cross-sectional view of an assembly 206 subsequent to forming a top electrode 108 on the active metal 106 of the assembly 204 (FIG. 7). The top electrode 108 may take any of the forms disclosed herein. The thickness 138 of the top electrode 108 may take the form of any of the embodiments of the thickness 132 of the bottom electrode 102. The assembly 206 may take the form of the MFMD 100 of FIG. 1.

As noted above, any suitable techniques may be used to manufacture the MFMDs 100 and memory cells 160 disclosed herein. FIG. 9 is a flow diagram of an illustrative method 1000 of manufacturing a memory cell, in accordance with various embodiments. Although the operations discussed below with reference to the method 1000 are illustrated in a particular order and depicted once each, these operations may be repeated or performed in a different order (e.g., in parallel), as suitable. Additionally, various operations may be omitted, as suitable. Various operations of the method 1000 may be illustrated with reference to one or more of the embodiments discussed above, but the method 1000 may be used to manufacture any suitable memory cell (including any suitable ones of the embodiments disclosed herein).

At 1002, a transistor may be formed in a device layer of an electronic device. For example, a transistor 110 may be formed in a device layer 154 of an electronic device 150, as discussed above with reference to FIGS. 1 and 3. The transistor may be an NMOS transistor or a PMOS transistor.

At 1004, an interconnect structure may be formed. The interconnect structure may couple to an S/D region of the transistor (1002). For example, an interconnect structure including one or more S/D contacts 156, conductive vias 112, and/or conductive lines 114 may be formed, as discussed above with reference to FIGS. 1 and 3.

At 1006, an MFMD may be formed above the device layer. A bottom electrode of the MFMD may be in contact with the interconnect structure, and an active metal or an electrolytic material may be in contact with the bottom electrode when the transistor is a PMOS transistor or an NMOS transistor, respectively. For example, an MFMD 100 may be formed above the device layer 154 in the electronic device 150, in accordance with any of the embodiments discussed above with reference to FIGS. 1, 3, and 5-8. The MFMD 100 may include a bottom electrode 102 in contact with an interconnect structure to conductive-couple the bottom electrode 102 to an S/D region 118 of the transistor 110. The electrolyte 104 may be in contact with the bottom electrode 102 when the transistor is an NMOS transistor (e.g., as discussed above with reference to FIGS. 1 and 2), and the active metal 106 may be in contact with the bottom electrode when the transistor is a PMOS transistor (e.g., as discussed above with reference to FIGS. 3 and 4).

The MFMDs 100 and memory cells 160 disclosed herein may be included in any suitable electronic device. FIGS. 10A-B are top views of a wafer 450 and dies 452 that may be formed from the wafer 450; the dies 452 may include any of the MFMDs 100 or memory cells 160 disclosed herein. The wafer 450 may include semiconductor material and may include one or more dies 452 having integrated circuit elements (e.g., MFMDs 100 and transistors 110) formed on a surface of the wafer 450. Each of the dies 452 may be a repeating unit of a semiconductor product that includes any suitable device (e.g., the electronic device 150). After the fabrication of the semiconductor product is complete, the wafer 450 may undergo a singulation process in which each of the dies 452 is separated from one another to provide discrete "chips" of the semiconductor product. A die 452 may include one or more MFMDs 100 or memory cells 160 and/or supporting circuitry to route electrical signals to the MFMDs 100 or memory cells 160 (e.g., interconnects including conductive vias 112 and lines 114), as well as any other integrated circuit (IC) components. In some embodiments, the wafer 450 or the die 452 may include other memory devices, logic devices (e.g., AND, OR, NAND, or NOR gates), or any other suitable circuit element. Multiple ones of these devices may be combined on a single die 452. For example, a memory array formed by multiple memory devices (e.g., multiple MFMDs 100) may be formed on a same die 452 as a processing device (e.g., the processing device 2002 of FIG. 12) or other logic that is configured to store information in the memory devices or execute instructions stored in the memory array.

Figure 11:
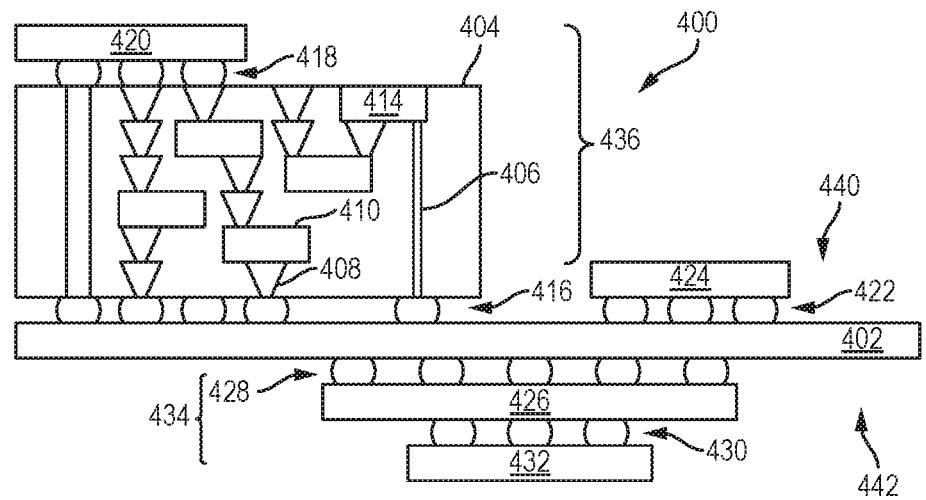
FIG. 11 is a cross-sectional side view of a device assembly that may include any of the MFMDs disclosed herein.

FIG. 11 is a cross-sectional side view of a device assembly 400 that may include any of the MFMDs 100 or memory cells 160 disclosed herein included in one or more packages. A "package" may refer to an electronic component that includes one or more IC devices that are structured for coupling to other components; for example, a package may include a die coupled to a package substrate that provides electrical routing and mechanical stability to the die. The device assembly 400 includes a number of components disposed on a circuit board 402. The device assembly 400 may include components disposed on a first face 440 of the circuit board 402 and an opposing second face 442 of the circuit board 402; generally, components may be disposed on one or both faces 440 and 442.

In some embodiments, the circuit board 402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 402. In other embodiments, the circuit board 402 may be a package substrate or flexible board.

The device assembly 400 illustrated in FIG. 11 includes a package-on-interposer structure 436 coupled to the first face 440 of the circuit board 402 by coupling components 416. The coupling components 416 may electrically and mechanically couple the package-on-interposer structure 436 to the circuit board 402, and may include solder balls, male and female portions of a socket, an adhesive, an underfill material, and/or any other suitable electrical and/or mechanical coupling structure.

The package-on-interposer structure 436 may include a package 420 coupled to an interposer 404 by coupling components 418. The coupling components 418 may take any suitable form for the application, such as the forms discussed above with reference to the coupling components 416. Although a single package 420 is shown in FIG. 11, multiple packages may be coupled to the interposer 404; indeed, additional interposers may be coupled to the interposer 404. The interposer 404 may provide an intervening substrate used to bridge the circuit board 402 and the package 420. The package 420 may include one or more MFMDs 100 or memory cells 160, for example. Generally, the interposer 404 may spread a connection to a wider pitch or reroute a connection to a different connection. For example, the interposer 404 may couple the package 420 (e.g., a die) to a ball grid array (BGA) of the coupling components 416 for coupling to the circuit board 402. In the embodiment illustrated in FIG. 11, the package 420 and the circuit board 402 are attached to opposing sides of the interposer 404; in other embodiments, the package 420 and the circuit board 402 may be attached to a same side of the interposer 404. In some embodiments, three or more components may be interconnected by way of the interposer 404.

The interposer 404 may be formed of an epoxy resin, a fiberglass-reinforced epoxy resin, a ceramic material, or a polymer material such as polyimide. In some embodiments, the interposer 404 may be formed of alternate rigid or flexible materials that may include the same materials described above for use in a semiconductor substrate, such as silicon, germanium, and other group III-V and group IV materials. The interposer 404 may include metal interconnects 408 and vias 410, including but not limited to through-silicon vias (TSVs) 406. The interposer 404 may further include embedded devices 414, including both passive and active devices. Such devices may include, but are not limited to, capacitors, decoupling capacitors, resistors, inductors, fuses, diodes, transformers, sensors, electrostatic discharge (ESD) devices, and memory devices (e.g., the MFMDs 100 or the memory cells 160). More complex devices such as radio-frequency (RF) devices, power amplifiers, power management devices, antennas, arrays, sensors, and micro-electromechanical systems (MEMS) devices may also be formed on the interposer 404. The package-on-interposer structure 436 may take the form of any of the package-on-interposer structures known in the art.

The device assembly 400 may include a package 424 coupled to the first face 440 of the circuit board 402 by coupling components 422. The coupling components 422 may take the form of any of the embodiments discussed above with reference to the coupling components 416, and the package 424 may take the form of any of the embodiments discussed above with reference to the package 420. The package 424 may include one or more MFMDs 100 or memory cells 160, for example.

The device assembly 400 illustrated in FIG. 11 includes a package-on-package structure 434 coupled to the second face 442 of the circuit board 402 by coupling components 428. The package-on-package structure 434 may include a package 426 and a package 432 coupled together by coupling components 430 such that the package 426 is disposed between the circuit board 402 and the package 432. The coupling components 428 and 430 may take the form of any of the embodiments of the coupling components 416 discussed above, and the packages 426 and 432 may take the form of any of the embodiments of the package 420 discussed above. Each of the packages 426 and 432 may include one or more MFMDs 100 or memory cells 160, for example.

Figure 12:
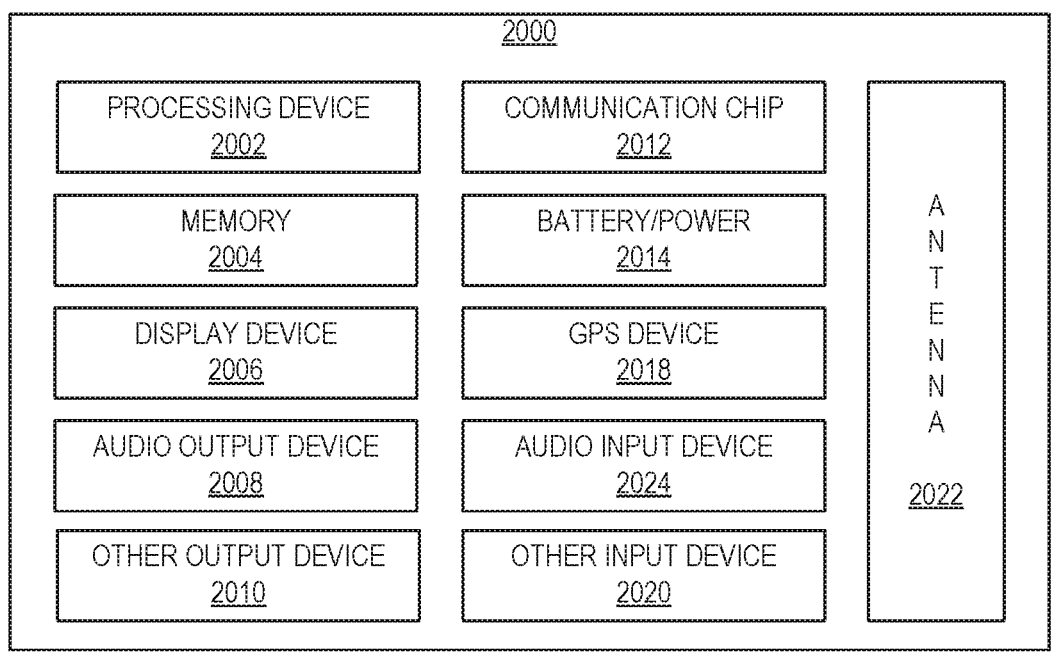
FIG. 12 is a block diagram of an example computing device that may include any of the MFMDs disclosed herein, in accordance with various embodiments.

FIG. 12 is a block diagram of an example computing device 2000 that may include any of the MFMDs 100 or memory cells 160 disclosed herein. A number of components are illustrated in FIG. 12 as included in the computing device 2000, but any one or more of these components may be omitted or duplicated, as suitable for the application. In some embodiments, some or all of the components included in the computing device 2000 may be attached to one or more printed circuit boards (e.g., a motherboard). In some embodiments, various ones of these components may be fabricated onto a single system-on-a-chip (SoC) die. Additionally, in various embodiments, the computing device 2000 may not include one or more of the components illustrated in FIG. 12, but the computing device 2000 may include interface circuitry for coupling to the one or more components. For example, the computing device 2000 may not include a display device 2006, but may include display device interface circuitry (e.g., a connector and driver circuitry) to which a display device 2006 may be coupled. In another set of examples, the computing device 2000 may not include an audio input device 2024 or an audio output device 2008, but may include audio input or output device interface circuitry (e.g., connectors and supporting circuitry) to which an audio input device 2024 or audio output device 2008 may be coupled.

The computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may interface with one or more of the other components of the computing device 2000 (e.g., the communication chip 2012 discussed below, the display device 2006 discussed below, etc.) in a conventional manner. The processing device 2002 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The computing device 2000 may include a memory 2004, which may itself include one or more memory devices such as volatile memory (e.g., dynamic random access memory (DRAM)), nonvolatile memory (e.g., read-only memory (ROM)), flash memory, solid state memory, and/or a hard drive. The memory 2004 may include one or more MFMDs 100 or memory cells 160. In some embodiments, the memory 2004 may include memory that shares a die with the processing device 2002. This memory may be used as cache memory and may include embedded dynamic random access memory (eDRAM) or spin transfer torque magnetic random-access memory (STT-MRAM).

In some embodiments, the computing device 2000 may include a communication chip 2012 (e.g., one or more communication chips). For example, the communication chip 2012 may be configured for managing wireless communications for the transfer of data to and from the computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 1402.11 family), IEEE 1402.16 standards (e.g., IEEE 1402.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 1402.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1402.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as GPS, EDGE, GPRS, CDMA, WiMAX, LTE, EV-DO, or others. In some embodiments, a first communication chip 2012 may be dedicated to wireless communications, and a second communication chip 2012 may be dedicated to wired communications.

The computing device 2000 may include battery/power circuitry 2014. The battery/power circuitry 2014 may include one or more energy storage devices (e.g., batteries or capacitors) and/or circuitry for coupling components of the computing device 2000 to an energy source separate from the computing device 2000 (e.g., AC line power).

The computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The computing device 2000 may include an audio output device 2008 (or corresponding interface circuitry, as discussed above). The audio output device 2008 may include any device that generates an audible indicator, such as speakers, headsets, or earbuds, for example.

The computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The computing device 2000 may include a global positioning system (GPS) device 2018 (or corresponding interface circuitry, as discussed above). The GPS device 2018 may be in communication with a satellite-based system and may receive a location of the computing device 2000, as known in the art.

The computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The following paragraphs provide various examples of the embodiments disclosed herein.

Example 1 is an electronic device, including: a transistor having a source/drain region; and a metal filament memory device (MFMD) including an active metal and an electrolyte; wherein the electrolyte is coupled between the active metal and the source/drain region when the transistor is an n-type metal oxide semiconductor (NMOS) transistor, and the active metal is coupled between the electrolyte and the source/drain region when the transistor is a p-type metal oxide semiconductor (PMOS) transistor.

Example 2 may include the subject matter of Example 1, and may further specify that the MFMD includes a bottom electrode, and the active metal is disposed on the bottom electrode when the transistor is a PMOS transistor.

Example 3 may include the subject matter of Example 2, and may further specify that the electrolyte is disposed on the bottom electrode when the transistor is a PMOS transistor.

Example 4 may include the subject matter of Example 3, and may further specify that the MFMD further includes a top electrode, and the top electrode is disposed on the electrolyte when the transistor is a PMOS transistor.

Example 5 may include the subject matter of Example 4, and may further specify that the top electrode is disposed on the active metal when the transistor is an NMOS transistor.

Example 6 may include the subject matter of any of Examples 1-5, and may further include a word line coupled to a gate of the transistor.

Example 7 may include the subject matter of any of Examples 1-6, and may further include a bit line, wherein the active metal is disposed between the electrolyte and the bit line when the transistor is an NMOS transistor, and the electrolyte is disposed between the active metal and the bit line when the transistor is a PMOS transistor.

Example 8 may include the subject matter of any of Examples 1-7, and may further specify that the electrolyte is a solid electrolyte.

Example 9 may include the subject matter of any of Examples 1-8, and may further specify that the electrolyte includes a group-IV alloy or a group-VI alloy.

Example 10 may include the subject matter of any of Examples 1-9, and may further specify that the active metal is copper or silver.

Example 11 is a method of manufacturing a memory cell, including: forming a transistor having a source/drain region, wherein the transistor is an n-type metal oxide semiconductor (NMOS) transistor or a p-type metal oxide semiconductor (PMOS) transistor; forming an interconnect structure in an interlayer dielectric, wherein the interconnect structure contacts the source/drain region; after forming the interconnect structure, forming a bottom electrode in contact with the interconnect structure; and forming an active metal on the bottom electrode when the transistor is a PMOS transistor, or forming an electrolyte layer on the bottom electrode when the transistor is an NMOS transistor.

Example 12 may include the subject matter of Example 11, and may further specify that the transistor is a PMOS transistor, and the method further includes forming an electrolyte layer on the active metal.

Example 13 may include the subject matter of Example 11, and may further specify that the transistor is an NMOS transistor, and the method further includes forming an active metal on the electrolyte layer.

Example 14 may include the subject matter of any of Examples 11-13, and may further include forming a top electrode such that the active metal or the electrolyte layer are disposed between the bottom electrode and the top electrode.

Example 15 may include the subject matter of Example 14, and may further include coupling the top electrode to a bit line.

Example 16 may include the subject matter of any of Examples 11-15, and may further include coupling a gate of the transistor to a word line.

Example 17 may include the subject matter of any of Examples 11-16, and may further specify that the electrolyte layer is formed by physical vapor deposition.

Example 18 is a method of operating a memory cell, including: controlling current to a metal filament memory device (MFMD), through a transistor, to set the MFMD in a low resistance state, wherein the MFMD includes an active metal and an electrolyte; and controlling current to the MFMD, through the transistor, to reset the MFMD to a high resistance state; wherein, when the electrolyte is coupled between the active metal and the transistor, using the transistor to control current to the MFMD to set the MFMD in the low resistance state causes source degeneration of the transistor, and when the active metal is coupled between the electrolyte and the transistor, using the transistor to control current to the MFMD to reset the MFMD in the high resistance state causes source degeneration of the transistor.

Example 19 may include the subject matter of Example 18, and may further specify that the transistor is an n-type metal oxide semiconductor (NMOS) transistor, and the electrolyte is coupled between the active metal and a source/drain region of the NMOS transistor.

Example 20 may include the subject matter of Example 18, and may further specify that the transistor is a p-type metal oxide semiconductor (PMOS) transistor, and the active metal is coupled between the electrolyte and a source/drain region of the NMOS transistor.

Example 21 may include the subject matter of any of Examples 18-20, and may further specify that controlling current to the MFMD includes controlling a voltage applied to a gate of the transistor.

Example 22 may include the subject matter of Example 21, and may further specify that controlling current to the MFMD includes controlling a voltage applied to a terminal of the MFMD.

Example 23 is a computing device, including: a circuit board; a processing device coupled to the circuit board; and a memory device coupled to the processing device, wherein the memory device includes a memory cell having a metal filament memory device (MFMD) coupled to a transistor, the transistor is to control current through the MFMD during set and reset of the MFMD, and a magnitude of a set voltage of the MFMD is different from a magnitude of the reset voltage of the MFMD; wherein the transistor is to undergo source degeneration during set when the magnitude of the set voltage is smaller than the magnitude of the reset voltage, and wherein the transistor is to undergo source degeneration during reset when the magnitude of the reset voltage is smaller than the magnitude of the set voltage.

Example 24 may include the subject matter of Example 23, and may further specify that the MFMD includes an active metal and an electrolyte, the electrolyte is coupled between the active metal and the transistor, and the transistor is an n-type metal oxide semiconductor (NMOS) transistor.

Example 25 may include the subject matter of Example 23, and may further specify that the MFMD includes an active metal and an electrolyte, the active metal is coupled between the electrolyte and the transistor, and the transistor is a p-type metal oxide semiconductor (PMOS) transistor.

The invention claimed is:

1. An electronic device, comprising:
a transistor having a source/drain region; and
a metal filament memory device (MFMD) including a bottom electrode, an active metal layer, an electrolyte layer, a barrier layer between the active metal layer and the electrolyte layer, and a top electrode;
wherein the electrolyte layer is coupled between the active metal layer and the source/drain region when the transistor is an n-type metal oxide semiconductor (NMOS) transistor, and the active metal layer is coupled between the electrolyte layer and the source/drain region when the transistor is a p-type metal oxide semiconductor (PMOS) transistor.

2. The electronic device of claim 1, wherein the active metal layer is on the bottom electrode when the transistor is a PMOS transistor.

3. The electronic device of claim 2, wherein the electrolyte layer is on the bottom electrode when the transistor is an NMOS transistor.

4. The electronic device of claim 3, wherein the top electrode is on the electrolyte layer when the transistor is a PMOS transistor.

5. The electronic device of claim 1, wherein the MFMD further includes a top electrode, and the top electrode is on the active metal layer when the transistor is an NMOS transistor.

6. The electronic device of claim 1, further comprising:
a word line coupled to a gate of the transistor.

7. The electronic device of claim 1, further comprising:
a bit line;
wherein the active metal layer is between the electrolyte layer and the bit line when the transistor is an NMOS transistor, and the electrolyte layer is between the active metal layer and the bit line when the transistor is a PMOS transistor.

8. The electronic device of claim 1, wherein the electrolyte layer is a solid electrolyte.

9. The electronic device of claim 1, wherein the electrolyte layer includes a group-IV alloy or a group-VI alloy.

10. The electronic device of claim 1, wherein the active metal layer is copper or silver.

11. The electronic device of claim 1, wherein the barrier layer comprises at least one of tantalum and tungsten.

12. The electronic device of claim 1, wherein the electrolyte layer comprises a multilayer oxide.

13. The electronic device of claim 1, wherein the bottom electrode comprises an inert metal.

14. The electronic device of claim 13, wherein the top electrode comprises an inert metal.

15. A computing device, comprising:
a circuit board;
a processing device coupled to the circuit board; and
a memory device coupled to the processing device, wherein the memory device includes a memory cell having a metal filament memory device (MFMD) coupled to a transistor, the MFMD comprises a bottom electrode, an electrolyte layer, an active metal layer, a top electrode, and a barrier layer between the active metal layer and the electrolyte layer, wherein the electrolyte layer is coupled between the active metal layer and the transistor when the transistor is an n-type metal oxide semiconductor (NMOS) transistor, and the active metal layer is coupled between the electrolyte layer and the transistor when the transistor is a p-type metal oxide semiconductor (PMOS) transistor.

* * * * *